(12) United States Patent
Hayashi et al.

(10) Patent No.: US 11,251,034 B2
(45) Date of Patent: Feb. 15, 2022

(54) FILM FORMING METHOD AND SUBSTRATE PROCESSING APPARATUS

(71) Applicant: TOKYO ELECTRON LIMITED, Tokyo (JP)

(72) Inventors: Hiroyuki Hayashi, Yamanashi (JP); Rui Kanemura, Yamanashi (JP); Satoshi Takagi, Yamanashi (JP); Mitsuhiro Okada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 169 days.

(21) Appl. No.: 16/281,418

(22) Filed: Feb. 21, 2019

(65) Prior Publication Data
US 2019/0259599 A1    Aug. 22, 2019

(30) Foreign Application Priority Data

Feb. 22, 2018    (JP) .............................. JP2018-030122

(51) Int. Cl.
*H01L 21/02* (2006.01)
*H01L 21/67* (2006.01)
*H01L 21/311* (2006.01)
*H01L 21/3205* (2006.01)
*C23C 16/02* (2006.01)
*C23C 16/24* (2006.01)

(52) U.S. Cl.
CPC ........ *H01L 21/02046* (2013.01); *C23C 16/02* (2013.01); *C23C 16/24* (2013.01); *H01L 21/0223* (2013.01); *H01L 21/02057* (2013.01); *H01L 21/02255* (2013.01); *H01L 21/02365* (2013.01); *H01L 21/31116* (2013.01); *H01L 21/3205* (2013.01); *H01L 21/67028* (2013.01)

(58) Field of Classification Search
CPC ........... H01L 21/02046; H01L 21/0206; H01L 21/02057; H01L 21/02661; H01L 21/31138
See application file for complete search history.

(56) References Cited

U.S. PATENT DOCUMENTS

2007/0015360 A1* 1/2007 Lu ................... H01L 21/28518
                                                            438/682
2016/0005602 A1* 1/2016 Yoo .................. H01L 21/31122
                                                            216/41

FOREIGN PATENT DOCUMENTS

| JP | 09-027457 A | 1/1997 |
|----|-------------|--------|
| JP | 2006-261633 A | 9/2006 |
| JP | 2016-122699 A | 7/2016 |
| WO | 2007/049510 A1 | 5/2007 |

* cited by examiner

*Primary Examiner* — John A Bodnar
(74) *Attorney, Agent, or Firm* — Nath, Goldberg & Meyer; Jerald L. Meyer; Tanya E. Harkins

(57) ABSTRACT

There is provided a film forming method comprising an organic substance removal step of removing an organic substance adhering to an oxide film generated on a surface of a base by supplying a hydrogen-containing gas and an oxygen-containing gas to the base; an oxide film removal step of removing the oxide film formed on the surface of the base after the organic substance removal step; and a film forming step of forming a predetermined film on the surface of the base after the oxide film removal step.

6 Claims, 7 Drawing Sheets

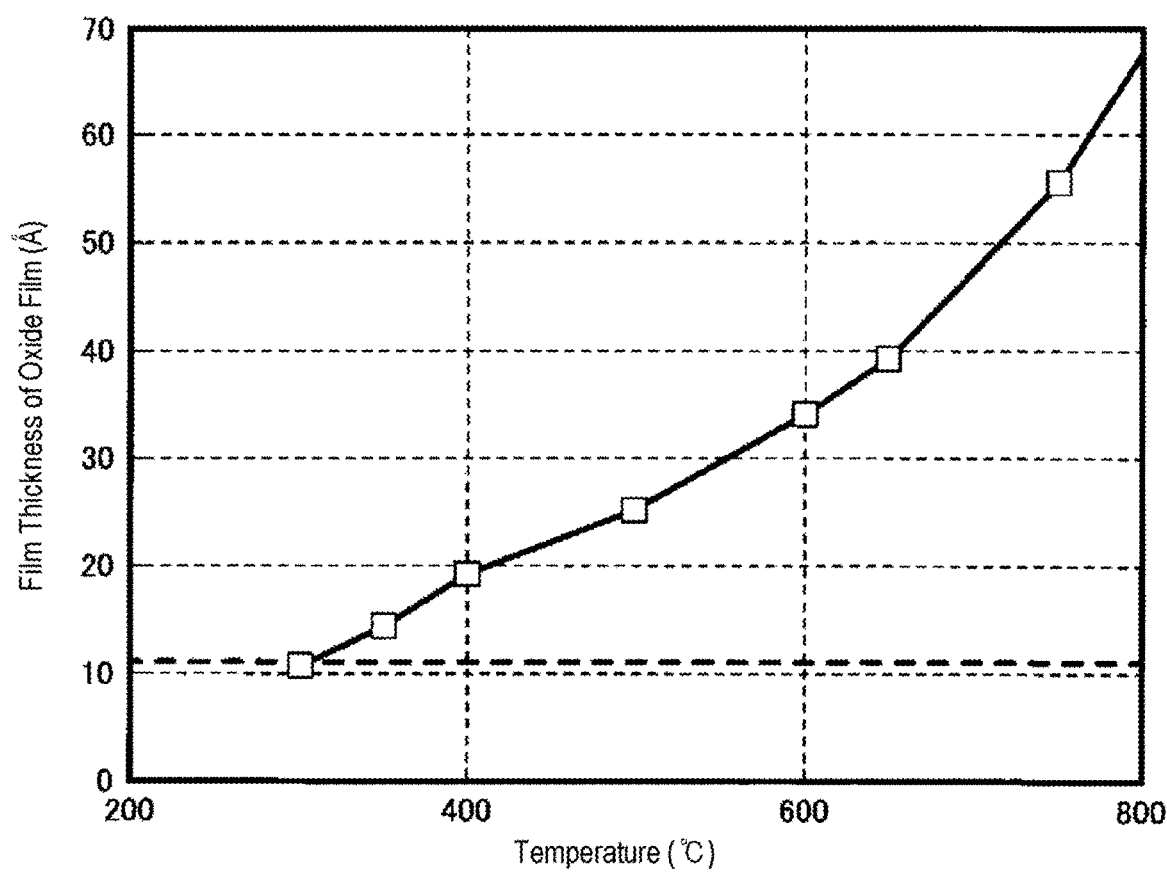

Ra=0.072 nm

Ra=0.112 nm

FILM FORMING METHOD AND SUBSTRATE PROCESSING APPARATUS

CROSS-REFERENCE TO RELATED APPLICATION

This application claims the benefit of Japanese Patent Application No. 2018-030122, filed on Feb. 22, 2018, in the Japan Patent Office, the disclosure of which is incorporated herein in its entirety by reference.

TECHNICAL FIELD

The present disclosure relates to a film forming method and a substrate processing apparatus.

BACKGROUND

Conventionally, there has been known a film forming method in which an oxide film produced on the surface of a silicon film is removed using a gas containing a halogen element and a basic gas, and then a silicon germanium film is formed on the exposed surface of the silicon film.

However, in the film forming method described above, when an organic substance has adhered to the surface of the oxide film, removal of the oxide film becomes incomplete, and abnormal growth such as deterioration of surface roughness may occur in subsequent film formation.

SUMMARY

In view of the above, an embodiment of the present disclosure provides a film forming method capable of forming a film having good surface roughness.

According to an embodiment of the present disclosure, there is provided a film forming method including: an organic substance removal step of removing an organic substance adhering to an oxide film generated on a surface of a base by supplying a hydrogen-containing gas and an oxygen-containing gas to the base; an oxide film removal step of removing the oxide film formed on the surface of the base after the organic substance removal step; and a film forming step of forming a predetermined film on the surface of the base after the oxide film removal step.

According to an embodiment of the present disclosure, there is provided a substrate processing apparatus including: a processing container configured to accommodate a substrate therein; a gas supply part configured to supply a hydrogen-containing gas and an oxygen-containing gas into the processing container; and a controller configured to control the gas supply part, wherein the controller is configured to perform control such that an organic substance removal step of removing an organic substance adhering to an oxide film generated on the substrate by supplying the hydrogen-containing gas and the oxygen-containing gas into the processing container, an oxide film removal step of removing the oxide film generated on the substrate of the base after the organic substance removal step, and a film forming step of forming a predetermined film on the surface of the substrate after the oxide film removal step are performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a diagram showing a relationship between the temperature in an organic substance removal step and the film thickness of an oxide film on a silicon substrate.

DETAILED DESCRIPTION

Figure 1:
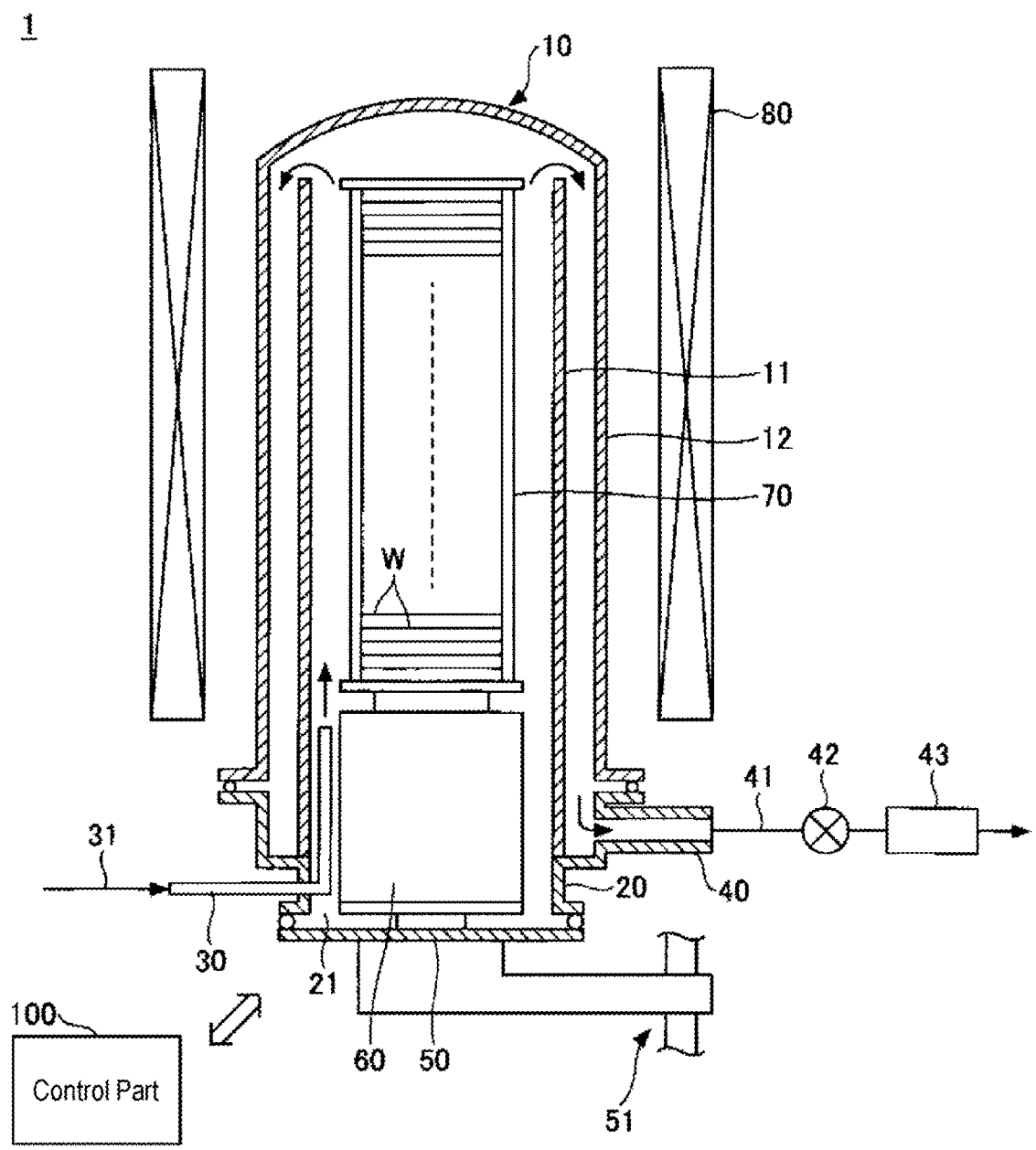
FIG. 1 is a cross-sectional view illustrating an example of a vertical heat treatment apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described with reference to detail so as not to unnecessarily obscure aspects of the various embodiments.

Hereinafter, embodiments for carrying out the present disclosure will be described with reference to drawings. In the specification and drawings, constituent elements that are substantially the same will be denoted by the same reference numerals, and redundant descriptions will be omitted.

Overall Configuration of Substrate Processing Apparatus

A substrate processing apparatus to which a film forming method according to an embodiment of the present disclosure is applicable will be described by taking a batch-type vertical heat treatment apparatus as an example. FIG. 1 is a cross-sectional view illustrating an example of a vertical heat treatment apparatus according to an embodiment of the present disclosure.

The vertical heat treatment apparatus 1 has a vertically elongated shape extending in the vertical direction as a whole. The vertical heat treatment apparatus 1 has a vertically elongated processing container 10 extending in the vertical direction.

The processing container 10 is made of, for example, quartz. The processing container 10 has a double tube structure of, for example, an inner tube 11 of a cylindrical body and an outer tube 12 having a ceiling and concentrically placed outside the inner tube 11. The lower end portion of the processing container 10 is hermetically held by, for example, a stainless-steel manifold 20.

The manifold 20 is fixed to, for example, a base plate (not illustrated). The manifold 20 has an injector 30 and a gas exhaust part 40.

The injector 30 is a gas supply part configured to introduce various kinds of gases into the processing container 10. The various kinds of gases include a processing gas and a purge gas. The processing gases include a gas used in an organic substance removal step, an oxide film removal step, and a film forming step described later. The gas used in the organic substance removal step may be, for example, a hydrogen-containing gas and an oxygen-containing gas. As the hydrogen-containing gas, for example, hydrogen ($H_2$) gas, ammonia ($NH_3$) gas, methane ($CH_4$) gas, and ethylene ($C_2H_4$) gas may be used. As the oxygen-containing gas, for example, oxygen ($O_2$) gas, nitrous oxide ($N_2O$) gas, nitrogen monoxide (NO) gas, water vapor ($H_2O$), hydrogen peroxide ($H_2O_2$), carbon monoxide (CO), and carbon dioxide ($CO_2$) gas may be used. The gas used in the oxide film removal step may be, for example, a halogen-containing gas or a basic gas. As the halogen-containing gas, for example, hydrogen fluoride (HF) gas may be used. As the basic gas, for example, ammonia ($NH_3$) gas may be used. The gas used in the film forming step may be appropriately selected by a person of ordinary skill in the art depending on the kind of the film to be formed. For example, when forming a silicon film, a silicon-containing gas may be used. As the silicon-containing gas, for example, silane ($SiH_4$) gas, disilane ($Si_2H_6$), trisilane ($Si_3H_8$) gas, and tetrasilane ($Si_4H_{10}$) gas, which are silicon hydride gases ($Si_nH_{2n+2}$), may be used. In addition, for example, monochlorosilane ($SiH_3Cl$), dichlorosilane ($SiH_2Cl_2$), trichlorosilane ($SiHCl_3$), silicon tetrachloride ($SiCl_4$), and hexachlorodisilane ($Si_2Cl_6$), which are chlorine-containing compound gases, may be used. For example, when forming a germanium film, a germanium-containing gas may be used. As the germanium-containing gas, for example, germane ($GeH_4$) and digermane ($Ge_2H_6$), which are germanium hydride gases ($Ge_nH_{2n+n}$) may be used. In addition, for example, monochlorogermane ($GeH_3Cl$), dichlorogermane ($GeH_2Cl_2$), trichlorogermane ($GeHCl_3$), germanium tetrachloride ($GeCl_4$), and hexachlorodigermane ($Ge_2Cl_6$), which are chlorine-containing compound gases, may be used. For example, when forming a silicon germanium film, the above-described silicon-containing gas and germanium-containing gas may be appropriately combined. The purge gas may be, for example, an inert gas such as nitrogen ($N_2$) gas or argon (Ar) gas.

A pipe 31 configured to introduce various kinds of gases is connected to the injector 30. In the pipe 31, flow rate adjustment parts (not illustrated) such as a mass flow controller configured to adjust a gas flow rate and a valve (not illustrated) are disposed. One injector 30 may be used, or multiple injectors 30 may be used. FIG. 1 illustrates a case where there is one injector 30.

The gas exhaust part 40 evacuates the inside of the processing container 10. A pipe 41 is connected to the gas exhaust part 40. In the pipe 41, for example, an opening-degree-variable valve 42 and a vacuum pump 43 are provided, which are capable of controlling pressure inside the processing container 10 in a reduced pressure state.

In the lower end portion of the manifold 20, a furnace opening 21 is formed. In the furnace opening 21, for example, a disk-shaped lid 50 made of stainless steel is provided.

The lid 50 is provided so as to be able to move up and down by a lift mechanism 51, and is configured to hermetically seal the furnace opening 21. On the lid 50, for example, a heat insulating cylinder 60 made of quartz is installed.

A wafer boat 70 made of, for example, quartz, which holds a large number of wafers W in multiple stages at a predetermined interval in a horizontal state, is placed on the heat insulating cylinder 60.

The wafer boat 70 is loaded into the processing container 10 and accommodated in the processing container 10 by raising the lid 50 using the lift mechanism 51. In addition, the wafer boat 70 is unloaded from the processing container 10 by lowering the lid 50. The wafer boat 70 has a groove structure having multiple slots (support grooves) in the longitudinal direction, and wafers W are stacked in the slots in a horizontal state at intervals in the vertical direction. The multiple wafers placed on the wafer boat 70 constitute one batch and are subjected to various heat treatments in batch units.

A heater 80 is provided outside the processing container 10. The heater 80 has, for example, a cylindrical shape, and heats the processing container 10 to a predetermined temperature.

The vertical heat treatment apparatus 1 is provided with a control part 100 configured with, for example, a computer. The control part 100 includes, for example, a data processing part including a program, a memory, and a CPU. In the program, commands (respective steps) are incorporated such that the control part 100 sends control signals to each part of the vertical heat treatment apparatus 1 so as to cause each processing step described below to proceed. The program is stored in a storage medium such as a computer storage medium such as a flexible disk, a compact disk, a hard disk, a MO (magneto-optical disk), or a memory card, and installed in the control part 100.

Film Forming Method

Figure 2:
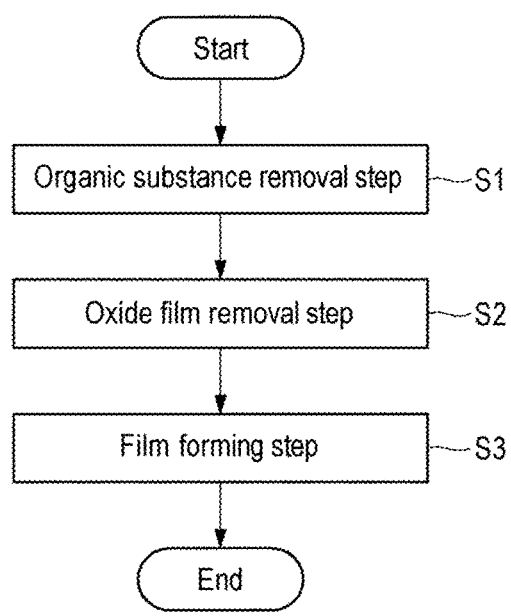
FIG. 2 is a flowchart illustrating an example of a film forming method according to an embodiment of the present disclosure.
Figure 3A:
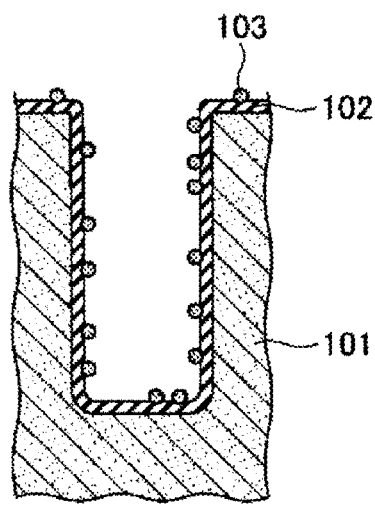
FIGS. 3A to 3D are cross-sectional views illustrating steps in an example of a film forming method according to an embodiment of the present disclosure.
Figure 3B:
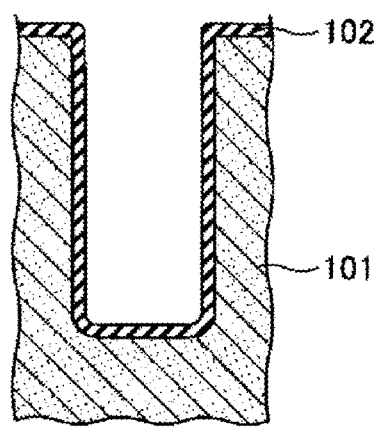
Figure 3C:
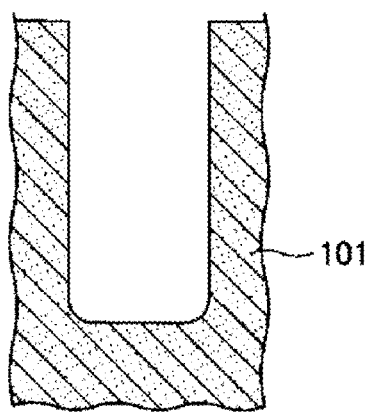
Figure 3D:
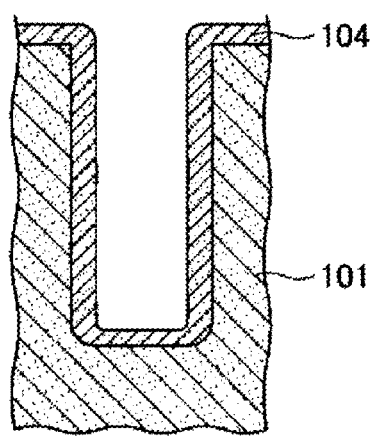

A film forming method according to an embodiment of the present disclosure will be described. The film forming method according to an embodiment of the present disclosure is performed, for example, by controlling, by the control part 100, the operation of each part of the vertical heat treatment apparatus 1. FIG. 2 is a flowchart illustrating an example of a film forming method according to an embodiment of the present disclosure. FIGS. 3A to 3D are cross-sectional views illustrating steps in an example of a film forming method according to an embodiment of the present disclosure.

In a film forming method according to an embodiment of the present disclosure, an organic substance removal step S1, an oxide film removal step S2, and a film forming step S3 are performed in this order. In the present embodiment, first, the wafer boat 70, which holds a large number of silicon substrates at predetermined intervals, each having an oxide film to which an organic substance has adhered on the surface thereof, is loaded into the processing container 10. Subsequently, the organic substance removal step S1, the oxide film removal step S2, and the film forming step S3 are successively performed in the processing container 10, which is the same processing container, under a vacuum atmosphere, whereby the organic substance and the oxide film on the surface of each silicon substrate are removed, and then a silicon film is formed. Further, between respective steps, a purge step of replacing the gas in the processing container 10 may be performed. Next, the wafer boat 70, which holds the silicon substrates on which the silicon film is formed is unloaded from the processing container 10.

The organic substance removal step S1, the oxide film removal step S2, and the film forming step S3 may be performed in different processing apparatuses. However, it is preferable to successively perform the steps in the same processing apparatus. Successively performing the steps in the same processing apparatus includes, for example, successively performing the processes in one processing container of a batch-type processing apparatus and successively performing the processes while changing the processing containers for each step in an apparatus having multiple processing containers and an atmosphere-controlled transport chamber. Since it is possible to avoid influence such as re-adhering of organic substances to the oxide film exposed by the organic substance removal step S1, by successively performing the steps in the same processing apparatus, it is unnecessary to perform strict atmosphere management and time management. This eliminates the need for complex line management. The atmosphere management means maintaining the atmosphere surrounding a wafer W as an inert atmosphere after, for example, the processes prior to film formation (the organic substance removal step S1 and the oxide film removal step S2). The time management means, for example, Q-time management. The Q-time means a time limit provided between steps in a series of substrate processes.

The organic substance removal step S1 is a step of removing an organic substance adhering to an oxide film generated on the surface of a base by supplying a hydrogen-containing gas and an oxygen-containing gas to the base (In-situ Organic Removal: IOR). In the present embodiment, $H_2$ gas and $O_2$ gas are introduced into the processing container 10 stabilized at a predetermined temperature from the injector 30 to remove the organic substance 103 adhering to the silicon oxide film 102 generated on the surface of the silicon substrate 101 (see FIGS. 3A and 3B). The predetermined temperature is preferably 200 degrees C. to 350 degrees C., for example. By setting the predetermined temperature to 200 degrees C. or higher, the reactivity between $H_2$ gas and $O_2$ gas and the organic substance 103 is improved, so that the time for removing the organic substance 103 can be shortened. By setting the predetermined temperature to 350 degrees C. or lower, it is possible to suppress oxidation of the silicon substrate 101 by $H_2$ gas and $O_2$ gas.

The oxide film removal step S2 is a step of removing an oxide film formed on the surface of the base. In the present embodiment, the silicon oxide film 102 generated on the surface of the silicon substrate 101 is removed by chemical oxide removal (COR) processing (see FIG. 3C). At this time, since the organic substance 103, which has adhered to the surface of the silicon oxide film 102, is removed in the organic substance removal step S1, it is possible to suppress incomplete removal of the silicon oxide film 102. The COR processing means processing of removing an oxide film by causing a halogen-containing gas and a basic gas to be adsorbed on an oxide film and to be chemically reacted with the oxide film so as to transform the oxide film into ammonium fluorosilicate (($NH_4)_2SiF_6$), which is a reaction product, and sublimating the ammonium fluorosilicate. For example, HF gas and $NH_3$ gas are introduced into the processing container 10 stabilized at a predetermined temperature from the injector 30, and HF gas and $NH_3$ gas are adsorbed to the silicon oxide film 102 and reacted with the silicon oxide film 102 so as to transform the silicon oxide film into $(NH_4)_2SiF_6$. The temperature at which the transformation is caused is preferably, for example, 25 degrees C. (room temperature) to 200 degrees C. By setting the temperature to be equal to or higher than the room temperature, a cooling mechanism for cooling the inside of the processing container 10 becomes unnecessary. By setting the temperature to 200 degrees C. or lower, it is possible to suppress diffusion of fluorine (F) into the silicon substrate 101. Next, $(NH_4)_2SiF_6$ is sublimated by heating the inside of the processing container 10 to a predetermined temperature (e.g., 300 degrees C. to 400 degrees C.). In the case of heating up to a temperature at which $(NH_4)_2SiF_6$ is sublimated in the film forming step S3, heating may not be performed in the oxide film removal step S2.

The film forming step S3 is a step of forming a predetermined film on the surface of a base. In the present embodiment, $Si_2H_6$ gas is introduced into the processing container 10 stabilized at a predetermined temperature (e.g., 400 degrees C.) from the injector 30 to form a silicon film 104 on the surface of the silicon substrate 101 (see FIG. 3D). At this time, since the surface of the silicon substrate 101 is cleaned by removing the organic substances in the organic substance removal step S1 and removing the oxide film by the oxide film removal step S2, it is possible to form a silicon film 104 having a good surface roughness on the surface of the silicon substrate 101.

The purge step is a step of replacing the gas within the processing container 10. In the present embodiment, $N_2$ gas is introduced into the processing container 10 from the injector 30, and the $H_2$ gas, $O_2$ gas, HF gas, and $NH_3$ gas remaining in the processing container 10 are replaced with the $N_2$ gas.

As described above, in the film forming method according to the embodiment of the present disclosure, an organic substance removal step S1, an oxide film removal step S2, and a film forming step S3 are performed in this order. As a result, since a predetermined film can be formed on a clean surface from which organic substances and an oxide films have been removed, it is possible to form a film having good surface roughness.

In the film forming method according to the embodiment of the present disclosure, a hydrogen-containing gas and an oxygen-containing gas are supplied to the base to remove organic substances on the surface of the base. As a result, even if a recess pattern such as a trench pattern or a hole pattern is formed on the surface of the base, pattern collapse can be suppressed and organic substances, which have adhered to the surface of the oxide film, can be removed. As a method for removing organic substances, it may be considered to perform wet cleaning such as ammonia hydrogen-peroxide mixture (APM) cleaning. However, when wet cleaning is performed, pattern collapse may occur when a recess pattern is formed on the surface of the base.

EXAMPLE

Examples of confirming the action and effect of the film forming method according to the embodiment of the present disclosure will be described.

Example 1

In Example 1, after adhering dioctyl phthalate (DOP), which is an organic substance, to the surface of a silicon substrate, a sample (Sample A), which was not subjected to the organic substance removal step S1, and a sample (Sample B), which was subjected to the organic substance removal step S1, were prepared. In the organic substance removal step S1, $H_2$ gas and $O_2$ gas were introduced from the injector 30 into the processing container 10 stabilized at 300 degrees C. for 30 minutes.

Subsequently, surface contamination of Sample A and Sample B was evaluated by time-of-flight secondary ion mass spectrometry (TOF-SIMS).

Figure 4:
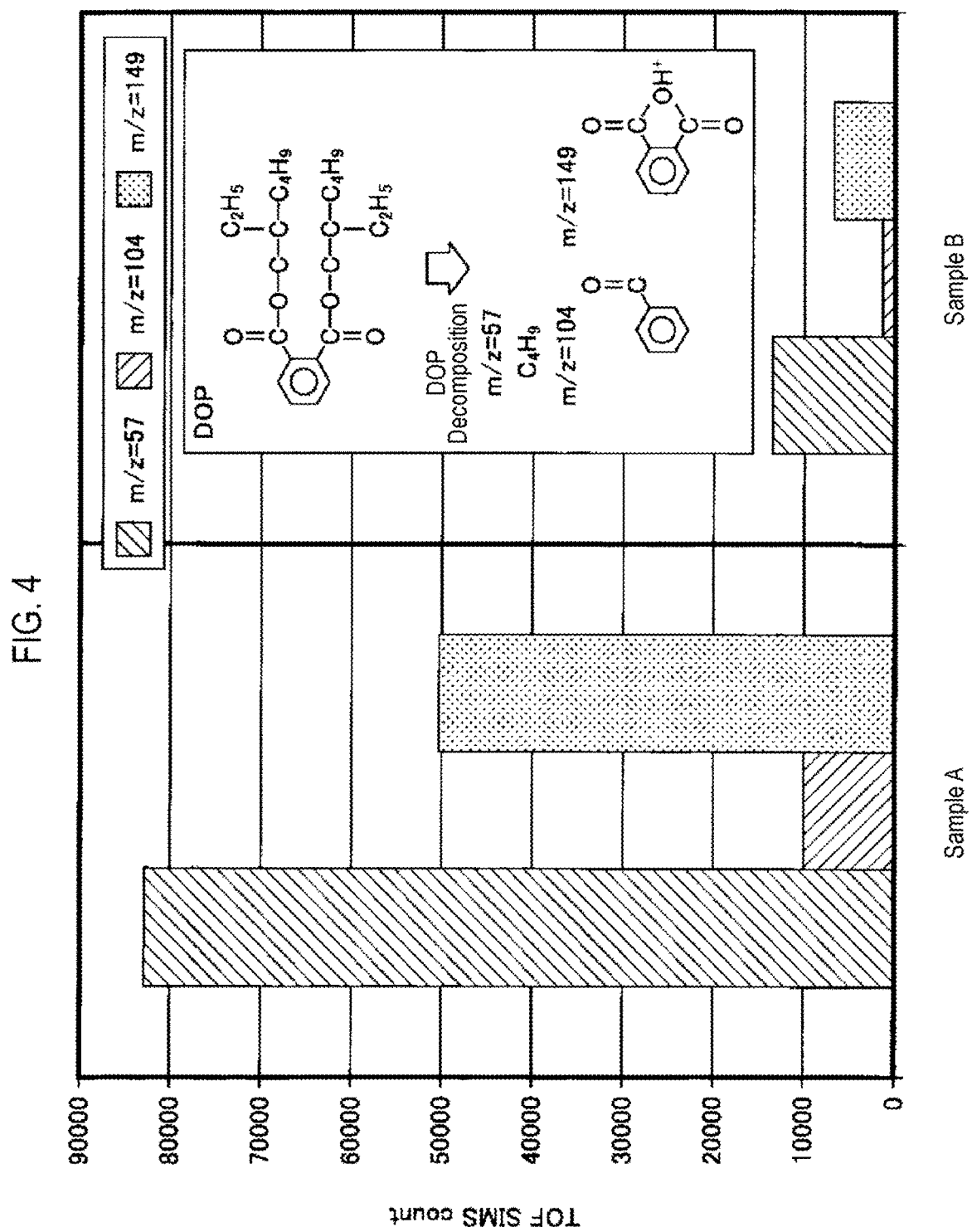
FIG. 4 is a diagram showing an evaluation result by TOF-SIMS.

FIG. 4 is a diagram showing the evaluation result by TOF-SIMS. FIG. 4 shows TOF-SIMS counts at mass numbers m/z=57, 104, and 149 (m: molecular mass, z: the number of charges) caused by DOP for each of Sample A and Sample B.

As shown in FIG. 4, it can be seen that at m/z=57, 104, and 149, TOF-SIMS counts in Sample B are smaller than those in Sample A, respectively. In other words, it can be seen that DOP, which has adhered to the surface of the silicon substrate, can be removed by performing the organic substance removal step S1. From this result, it is considered that organic substances, which have adhered to an oxide film generated on the surface of a base can be removed by the organic substance removal step S1.

Example 2

In Example 2, after performing the organic substance removal step S1 in the processing container 10 stabilized at 300 degrees C., 350 degrees C., 400 degrees C., 500 degrees C., 600 degrees C., 650 degrees C., and 750 degrees C., the influence on silicon substrates was evaluated by evaluating the film thickness of the oxide films on the surfaces of silicon substrates. In the organic substance removal step S1, $H_2$ gas and $O_2$ gas were introduced from the injector 30 into the processing container 10 for 30 minutes.

FIG. 5 is a diagram showing a relationship between the temperature in the organic substance removal step S1 and the film thickness of an oxide film on a silicon substrate. In FIG. 5, the horizontal axis represents the temperature (degrees C.) in the processing container 10 in the organic substance removal step S1, and the vertical axis represents the film thickness (Å) of an oxide film. In FIG. 5, the broken line indicates the film thickness (about 10 Å) of an oxide film formed on the silicon substrate before performing the organic substance removal step S1.

As shown in FIG. 5, it can be seen that oxidation of the silicon substrate by $H_2$ gas and $O_2$ gas can be particularly suppressed by setting the temperature in the organic substance removal step S1 to 350 degrees C. or lower. It can also be seen that oxidation of the silicon substrate by $H_2$ gas and $O_2$ gas can be prevented by setting the temperature in the organic substance removal step S1 to 300 degrees C. From this result, it is considered that the temperature in the organic substance removal step S1 is preferably 350 degrees C. or lower, more preferably 300 degrees C.

Example 3

In Example 3, by performing the organic substance removal step S1, the oxide film removal step S2, and the film forming step S3 in this order on a silicon substrate having on the surface thereof an oxide film and an organic substance attached to the oxide film, a silicon film (Sample C) was prepared. For comparison, by performing the oxide film removal step S2 and the film forming step S3 in this order without performing the organic substance removal step S1, a silicon film was formed on a silicon substrate (sample D). Process conditions of the organic substance removal step S1, the oxide film removal step S2, and the film forming step S3 are as follows.

(Organic Substance Removal Step S1)
Temperature in the processing container 10: 300 degrees C.
Pressure in the processing container 10: 0.35 Torr (46.7 Pa)
Gas flow rate: $H_2/O_2$=1000 sccm/1700 sccm
Gas supply time: 180 minutes
(Oxide Film Removal Step S2)
Temperature in the processing container 10: 50 degrees C.
Pressure in the processing container 10: 0.2 Torr (26.7 Pa)
Gas flow rate: $HF/NH_3$=40 sccm/1000 sccm
Gas supply time: 35 minutes
(Film Forming Step S3)
Temperature in the processing container 10: 380 degrees C.
Pressure in the processing container 10: 1.0 Torr (133.3 Pa)
Gas flow rate: $Si_2H_6$=350 sccm Next, the surface roughness of Sample C and Sample D was evaluated using an atomic force microscope (AFM).

Figure 6A:
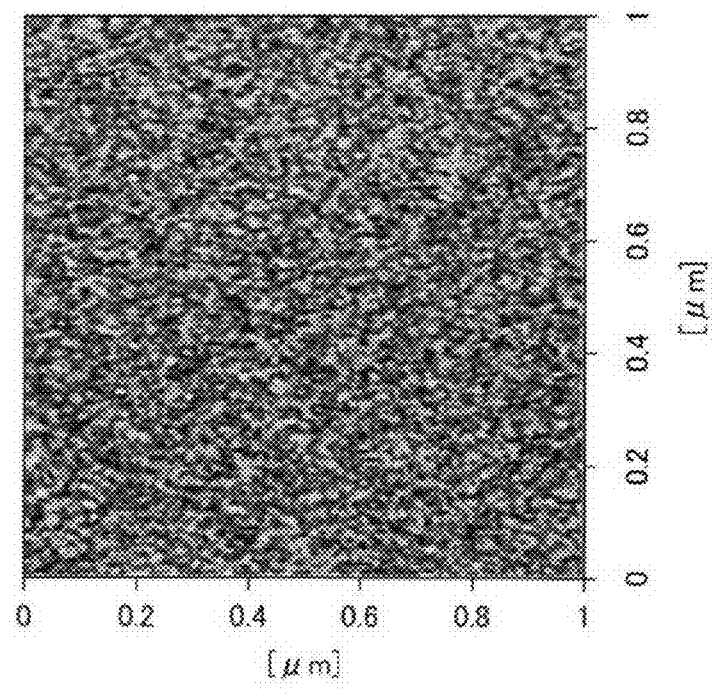
FIGS. 6A and 6B are diagrams showing evaluation results obtained using an AFM.
Figure 6B:
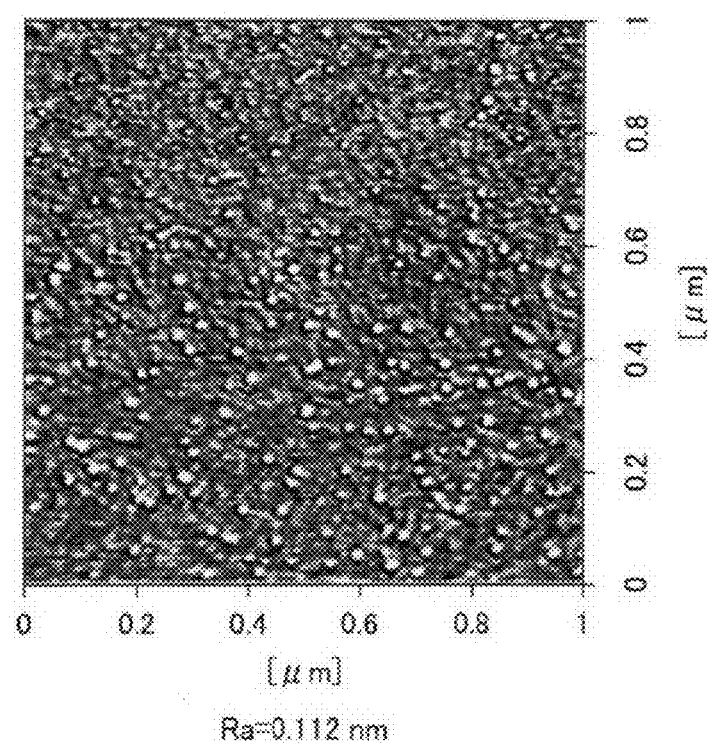

FIGS. 6A and 6B are diagrams showing evaluation results obtained using an AFM. FIG. 6A shows the AFM image and the arithmetic average roughness Ra of the surface of the silicon film of Sample C, and FIG. 6B shows the AFM image and the arithmetic average roughness Ra of the surface of the silicon film of Sample D.

As shown in FIG. 6A, in Sample C, the surface roughness of the silicon film was small, and the arithmetic average roughness Ra was 0.072 nm. Meanwhile, as shown in FIG. 6B, in Sample D, the surface roughness of the silicon film was large and the arithmetic average roughness Ra was 0.112 nm. That is, by performing the organic substance removal step S1, it can be seen that the surface roughness of the silicon film is reduced and the arithmetic average roughness Ra becomes about ⅔. In other words, it can be seen that a silicon film having good surface roughness can be formed by performing the organic substance removal step S1. From this result, it is considered that a film having good surface roughness can be formed by performing the organic substance removal step S1, the oxide film removal step S2, and the film forming step S3 in this order.

Although the embodiments for carrying out the present disclosure have been described above, the above contents do not limit the contents of the present disclosure, and various modifications and improvements are possible within the scope of the present disclosure.

In the embodiments described above, a batch-type vertical heat treatment apparatus, which performs processing on multiple wafers at a time, has been described as an example of a substrate-processing apparatus, but the present disclosure is not limited thereto. For example, the film forming apparatus may be a single wafer type apparatus, which processes wafers one by one. Further, for example, the film forming apparatus may be a semi-batch type apparatus, which processes a plurality of wafers disposed on a rotary table in a processing container are revolved by the rotary table and caused to sequentially pass through a region to which a source gas is supplied and a region to which a reaction gas reactive with the source gas is supplied so as to form a film on the surfaces of the wafers.

According to the film forming method disclosed herein, a film having good surface roughness can be formed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
an organic substance removal step of removing an organic substance without a plasma treatment by supplying a hydrogen-containing gas and an oxygen-containing gas to a base, the organic substance being adhered to an oxide film generated on a surface of the base;
an oxide film removal step of removing the oxide film formed on the surface of the base without a plasma treatment after the organic substance removal step; and
a film forming step of forming a predetermined film on the surface of the base after the oxide film removal step.

2. The method of claim 1, wherein the organic substance removal step, the oxide film removal step, and the film forming step are successively formed in a same apparatus.

3. The method of claim 1, wherein the organic substance removal step is performed at a temperature of 200 degrees C. to 350 degrees C.

4. The method of claim 1, wherein the oxide film removal step is performed at a temperature of 25 degrees C. to 200 degrees C.

5. The method of claim 1, wherein the oxide film removal step includes:
transforming the oxide film into a reaction product by reacting the oxide film with a halogen-containing gas and a basic gas; and
removing the reaction product by heating.

6. The method of claim 1, wherein a recess pattern is formed on the base.

* * * * *